(12) United States Patent
Yaraduyathinahalli et al.

(10) Patent No.: US 9,275,704 B2
(45) Date of Patent: Mar. 1, 2016

(54) METHOD AND APPARATUS FOR ASYNCHRONOUS FIFO CIRCUIT

(71) Applicant: Texas Instruments Incorporated, Dallas, TX (US)

(72) Inventors: Rakesh Channabasappa Yaraduyathinahalli, Bangalore (IN); Shekhar Dinkar Patil, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/515,326

(22) Filed: Oct. 15, 2014

(65) Prior Publication Data

US 2016/0035399 A1    Feb. 4, 2016

(30) Foreign Application Priority Data

Jul. 31, 2014   (IN) ............................. 3755/CHE/2014

(51) Int. Cl.
| | | |
|---|---|---|
| *G11C 8/16* | (2006.01) | |
| *G11C 7/22* | (2006.01) | |
| *G11C 7/10* | (2006.01) | |
| G11C 11/412 | (2006.01) | |

(52) U.S. Cl.
CPC .. *G11C 7/22* (2013.01); *G11C 7/10* (2013.01); *G11C 7/1075* (2013.01); *G11C 8/16* (2013.01); *G11C 11/412* (2013.01)

(58) Field of Classification Search
CPC ....... G11C 8/16; G11C 7/1075; G11C 11/412
USPC .............. 365/230.05, 189.05, 189.12, 189.08
See application file for complete search history.

(56) References Cited

U.S. PATENT DOCUMENTS 5,956,748 A * 9/1999 New ........................ G06F 5/10
365/230.05

* cited by examiner

*Primary Examiner* — Jason Lappas
(74) *Attorney, Agent, or Firm* — Ronald O. Neerings; Frank D. Cimino

(57) ABSTRACT

The disclosure provides an asynchronous FIFO circuit that includes a data memory which is coupled to a write data path and a read data path. The data memory receives a write clock and a read clock. A FIFO write pointer counter receives a write enable signal and the write clock. The FIFO write pointer counter provides a FIFO write pointer signal to the data memory. A FIFO read pointer counter receives a read enable signal and the read clock. The FIFO read pointer counter provides a FIFO read pointer signal to the data memory. A control circuit receives the write enable signal, the read enable signal, the FIFO write pointer signal, the FIFO read pointer signal, the write clock and the read clock. The control circuit generates a memory full signal when the data memory is full and a memory empty signal when the data memory is empty.

20 Claims, 4 Drawing Sheets

METHOD AND APPARATUS FOR ASYNCHRONOUS FIFO CIRCUIT

CROSS REFERENCES TO RELATED APPLICATIONS

This application claims priority from India provisional patent application No. 3755/CHE/2014 filed on Jul. 31, 2014 which is hereby incorporated by reference in its entirety.

TECHNICAL FIELD

The present disclosure is generally related to data storage and retrieval, and more particularly to an asynchronous FIFO (first-in-first-out) circuit.

BACKGROUND

Digital logic circuits associated with a memory storage unit can record the transfer of data, commands, or any other information (referred to as "data packets") with one or more other devices. Data transfer rates can differ between inserting data packets into a memory storage unit and extracting data packets from the memory storage unit.

Asynchronous FIFO (first-in-first-out) circuits provide an important data buffer function for reading and writing operations between two discrete machines of widely differing operating frequency. Asynchronous FIFO circuits are widely used for synchronization of data transfers where transmitter and receiver are working on different frequency and timings.

A FIFO circuit has a data memory that has a plurality of addressable locations. Read and write operations in the FIFO circuit are performed with read and write pointers respectively. The write pointer increments and points to a subsequent address location of the memory storage unit after each data packet insertion into the data memory. The read pointer similarly increments and points to a subsequent address location of the data memory after each data packet extraction from the memory storage unit.

The read and write pointers are compared to track the occupancy of the data memory. Based on the comparison, a signal such as a "memory full" or a "memory empty" is generated to indicate whether to continue with a data packet insertion or extraction operation respectively. If the data memory is full, the data packet insertion operation by an associated circuit will stop its write operation/data packet insertion. Similarly, if the data memory is empty, the associated circuit will stop the read operation/data packet extraction.

In conventional asynchronous FIFO circuits, comparators are used to compare the read and write pointers. The FIFO circuits which have a larger "depth" of the data memory, the sizes of the read pointers, write pointers and comparators increase proportionally. With the increase in comparator size, the insertion and extraction data rates are further reduced. This decreases the operating frequency (frequencies of read clock and write clock) thereby reducing the throughput of the system.

The generation of 'memory full' and 'memory empty' signals requires synchronization of the write and read pointers in the read and write clock domain respectively. Binary to Gray code and Gray to Binary converters are used to minimize the failures or avoid metastability condition in synchronization of the write and read pointers. Whenever there are setup and hold time violations in any flip-flop, it enters a state where its output is unpredictable; this state is known as metastable state. Metastability state presents potential failure conditions when the read clock and the write clock are very close in operating range.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides an asynchronous FIFO (first-in-first-out) circuit. The asynchronous FIFO circuit includes a data memory that is coupled to a write data path and a read data path. The data memory receives a write clock and a read clock. A FIFO write pointer counter receives a write enable signal and the write clock. The FIFO write pointer counter provides a FIFO write pointer signal to the data memory.

A FIFO read pointer counter receives a read enable signal and the read clock. The FIFO read pointer counter provides a FIFO read pointer signal to the data memory. A control circuit receives the write enable signal, the read enable signal, the FIFO write pointer signal, the FIFO read pointer signal, the write clock and the read clock. The control circuit generates a memory full signal when the data memory is full and a memory empty signal when the data memory is empty.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
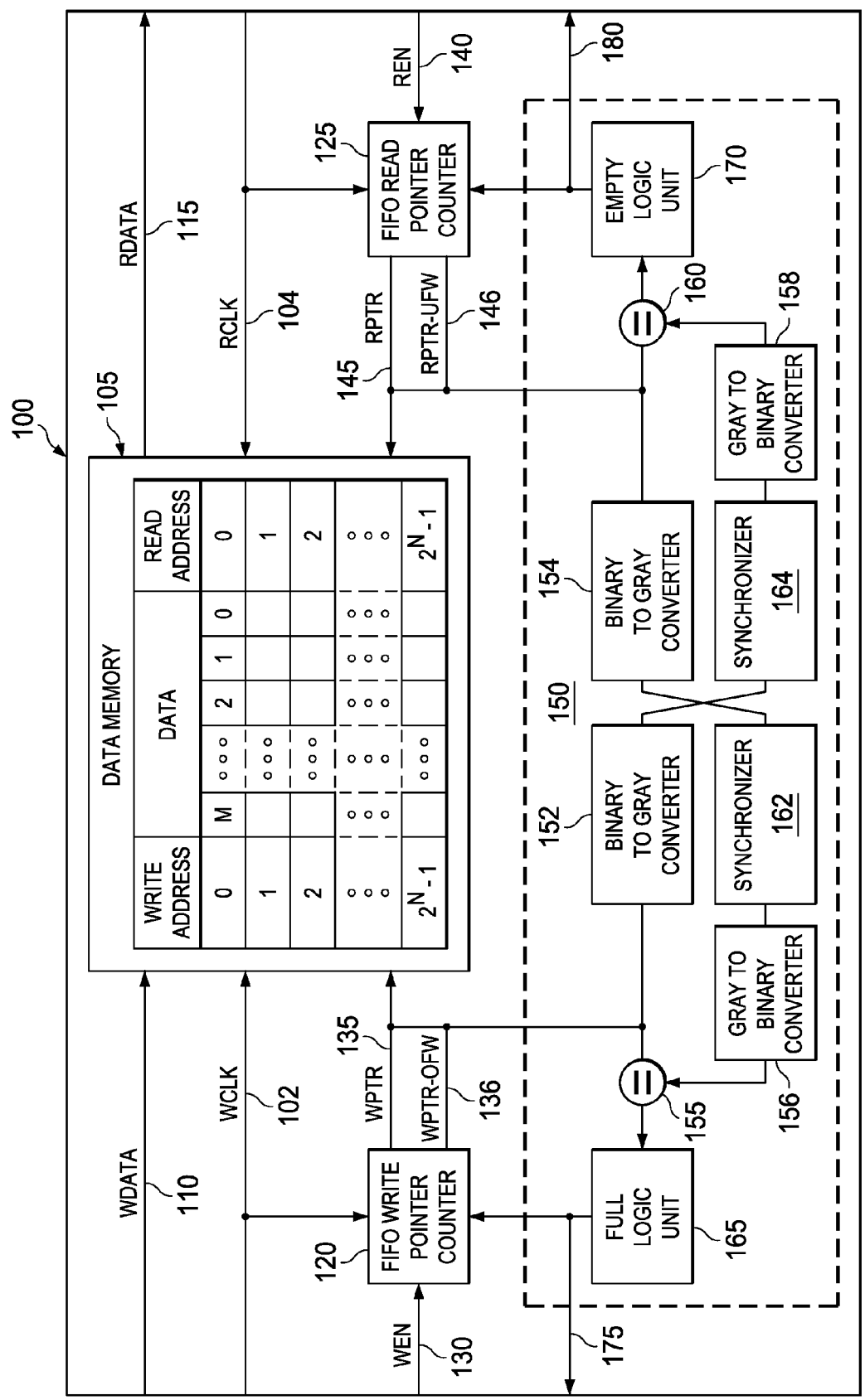
FIG. 1 illustrates a conventional asynchronous FIFO (first-in-first-out) circuit.

FIG. 1 illustrates a conventional asynchronous FIFO (first-in-first-out) circuit 100.

The conventional asynchronous FIFO circuit 100 includes a data memory 105. The data memory 105 includes $2^N$ rows and each row of the $2^N$ rows stores M bits, where M and N are integers. The data memory 105 is coupled to a write data path WDATA 110 and a read data path RDATA 115. The data memory 105 also receive a write clock WCLK 102 and a read clock RCLK 104.

A FIFO write pointer counter 120 receives a write enable signal WEN 130 and the write clock WCLK 102. The FIFO write pointer counter 120 provides a FIFO write pointer signal WPTR 135 to the data memory 105. A FIFO read pointer counter 125 receives a read enable signal REN 140 and the read clock RCLK 104. The FIFO read pointer counter 125 provides a FIFO read pointer signal RPTR 145 to the data memory 105.

The conventional asynchronous FIFO circuit 100 also includes a logic unit 150. The logic unit 150 includes a full logic unit 165, an empty logic unit 170, a full comparator 155, an empty comparator 160, a binary to gray converter 152, a binary to gray converter 154, a gray to binary converter 156, a gray to binary converter 158, a synchronizer 162 and a synchronizer 164.

The binary to gray converter 152 and the full comparator 155 receives the FIFO write pointer signal WPTR 135 and a write pointer overflow signal WPTR_OFW 136. The full logic unit 165 is coupled to the full comparator 155. The binary to gray converter 152 is coupled to the synchronizer 164 and the gray to binary converter 158 is coupled to the synchronizer 164. The empty comparator 160 receives an output of the gray to binary converter 158. The empty logic unit 170 is coupled to the empty comparator 160 and generates a memory empty signal 180. The FIFO read pointer counter 125 receives the memory empty signal 180.

The binary to gray converter 154 and the empty comparator 160 receives the FIFO read pointer signal RPTR 145 and a read pointer underflow signal RPTR_UFW 146. The binary to gray converter 154 is coupled to the synchronizer 162 and the gray to binary converter 156 is coupled to the synchronizer 162. The full comparator 155 receives an output of the gray to binary converter 156. The full logic unit 165 receives an output of the full comparator 155 and generates a memory full signal 175. The FIFO write pointer counter 120 receives the memory full signal 175.

The operation of the conventional asynchronous FIFO circuit 100, illustrated in FIG. 1 is explained now. The FIFO write pointer counter 120 counts a number of data packets written into the data memory 105. Also, the FIFO read pointer counter 125 counts a number of data packets cleared from the data memory 105. The FIFO write pointer signal WPTR 135 specify a mw in the data memory 105 corresponding to a current write address. The FIFO read pointer signal RPTR 145 specify a row in the data memory 105 corresponding to a current read address.

The FIFO read pointer signal RPTR 145 & the read pointer underflow signal RPTR_UFW 146 is synchronized to the write clock WCLK 102 through the binary to gray converter 154, the synchronizer 162 and the gray to binary converter 156. This is performed to avoid metastability. The full comparator 155 compares the FIFO write pointer signal WPTR 135 and the write pointer overflow signal WPTR_OFW 136 with the FIFO read pointer signal RPTR 145 and the read pointer underflow signal RPTR_UFW 146 (respectively) received from the gray to binary converter 156 and synchronized with the write clock WCLK 102.

The full comparator 155 will provide a signal to the full logic unit 165 when the FIFO read pointer signal RPTR 145 and the FIFO write pointer signal WPTR 135 specify a same row in the data memory 105 and also the read pointer underflow signal RPTR_UFW 146 and the write pointer overflow signal WPTR_OFW 136 do not match indicating that the FIFO write pointer signal WPTR 135 is overflowed. An output of the full comparator 155 is received by the full logic unit 165. Based on the result of the comparison performed by the full comparator 155, the full logic unit 165 generates the memory full signal 175.

Similarly, the FIFO write pointer signal WPTR 135 & write pointer overflow signal WPTR_OFW 136 is synchronized to the read clock RCLK 104 through the binary to gray converter 152, the synchronizer 164 and the gray to binary converter 158. This is performed to avoid metastability. The empty comparator 160 compares the FIFO read pointer signal RPTR 145 and the read pointer underflow signal RPTR_UFW 146 with the FIFO write pointer signal WPTR 135 & the write pointer overflow signal WPTR_OFW 136 (respectively) received from the gray to binary converter 158 and synchronized with the read clock RCLK 104.

The empty comparator 160 can also provide a signal to the empty logic unit 170 when the FIFO read pointer signal RPTR 145 and the FIFO write pointer signal WPTR 135 do specify a same row in the data memory 105 and also the read pointer underflow signal RPTR_UFW 146 and & the write pointer overflow signal WPTR_OFW 136 do match indicating that the FIFO write pointer signal WPTR 135 is not overflowed. An output of the empty comparator 160 is received by the empty logic unit 170. Based on the result of the comparison performed by the empty comparator 160, the empty logic unit 170 generates the memory empty signal 180.

The comparison of the FIFO write pointer signal WPTR 135 and the write pointer overflow signal WPTR_OFW 136 with the FIFO read pointer signal RPTR 145 and the read pointer underflow signal RPTR_UFW 146 limits an operating frequency and hence a throughput of the data memory 105. The performance of the conventional asynchronous FIFO circuit 100 is dependent on a speed of operation of the full comparator 155 and the empty comparator 160.

As a depth of the data memory 105 (or the number of rows in the data memory 105) increases, the size of the FIFO write pointer signal WPTR 135 and the FIFO read pointer signal RPTR 145 increases proportionately. Hence, an increase in the number of rows of the data memory 105 degrades the operating frequency and throughput of the data memory 105.

Figure 2:
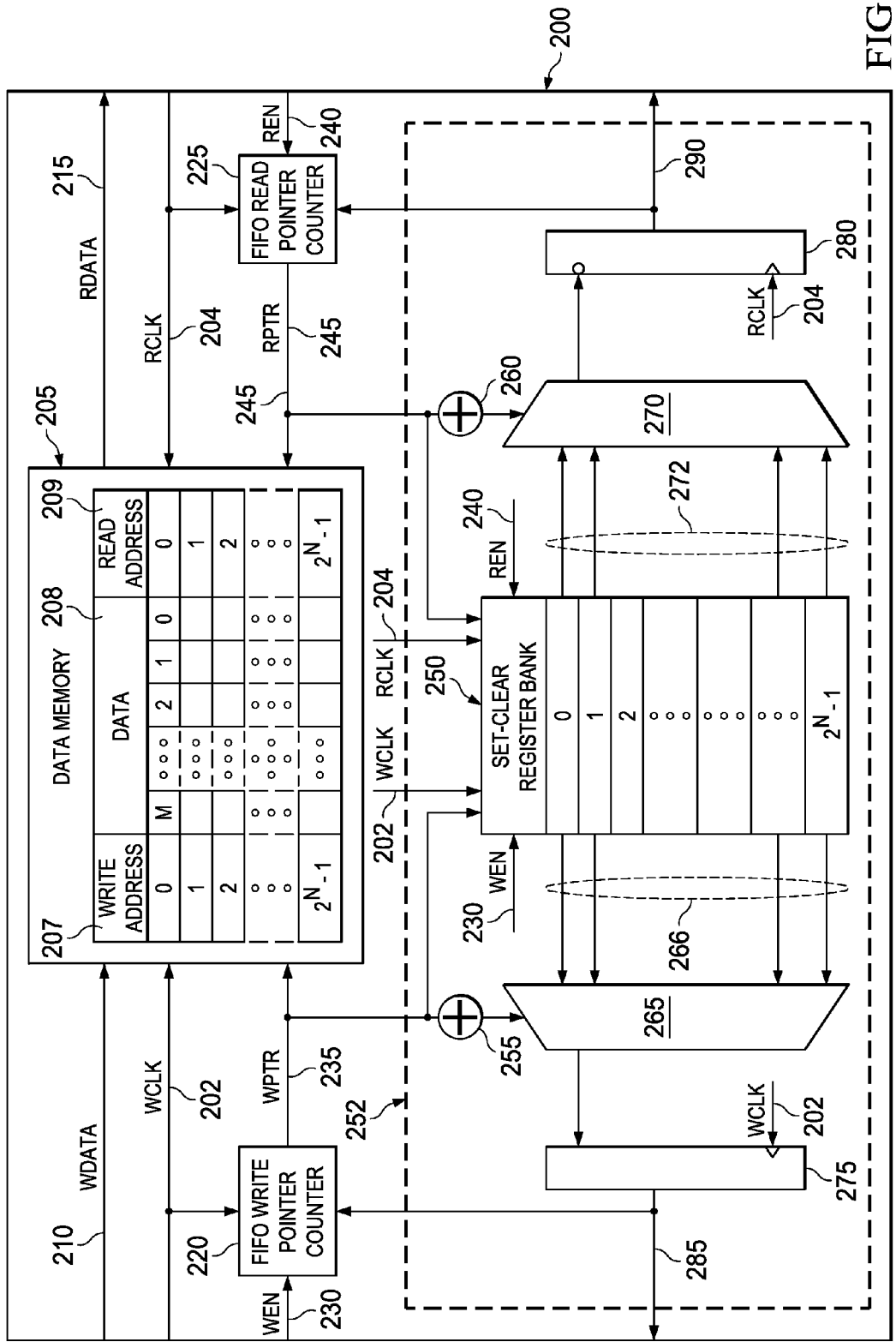
FIG. 2 illustrates an asynchronous FIFO (first-in-first-out) circuit, according to an embodiment.

FIG. 2 illustrates an asynchronous FIFO (first-in-first-out) circuit 200, according to an embodiment. The asynchronous FIFO circuit 200 includes a data memory 205. The data memory 205 includes $2^N$ rows and each row of the $2^N$ rows stores M bits, where M and N are integers. The data memory 205 includes a write address column 207, a data column 208 and a read address column 209. Each of the write address column 207, the data column 208 and the read address column 209 has $2^N$ rows. Each row of the $2^N$ rows in the data column 208 stores M bits. The data memory 205 is illustrated to have rows from 0 to $2^N-1$ row which sum to $2^N$ rows.

The data memory 205 is coupled to a write data path WDATA 210 and a read data path RDATA 215. The data memory 205 also receive a write clock WCLK 202 and a read clock RCLK 204. A FIFO write pointer counter 220 receives a write enable signal WEN 230 and the write clock WCLK 202. The FIFO write pointer counter 220 provides a FIFO write pointer signal WPTR 235 to the data memory 205. A FIFO read pointer counter 225 receives a read enable signal REN 240 and the read clock RCLK 204. The FIFO read pointer counter 225 provides a FIFO read pointer signal RPTR 245 to the data memory 205.

The asynchronous FIFO circuit 200 also includes a control circuit 252. The control circuit 252 includes a set-clear register bank 250. The set-clear register bank 250 includes $2^N$ rows. The set-clear register bank 250 is illustrated to have rows from 0 to $2^N-1$ row which sum to $2^N$ rows. Thus, a number of rows in the data memory 205 and in the set-clear register bank 250 are equal. In one version, a number of rows in the data memory 205 is not equal to a number of rows in the set-clear register bank 250.

The set-clear register bank 250 receives the write enable signal WEN 230, the read enable signal REN 240, the FIFO write pointer signal WPTR 235, the FIFO read pointer signal RPTR 245, the write clock WCLK 202 and the read clock RCLK 204. The write clock WCLK 202 is asynchronous with the read clock RCLK 204.

The control circuit 252 also includes a write increment block 255, a multiplexer 265 and a write flip-flop 275. The write increment block 255 receives the FIFO write pointer signal WPTR 235. The multiplexer 265 is coupled to each row of the $2^N$ rows in the set-clear register bank 250 through $2^N$ input lines 266. The multiplexer 265 is also coupled to the write increment block 255. The write flip-flop 275 is coupled to the multiplexer 265 and receives the write clock WCLK 202. The write flip-flop 275 generates a memory full signal 285. The FIFO write pointer counter 220 receives the memory full signal 285.

The control circuit 252 also includes a read increment block 260, a multiplexer 270 and a read flip-flop 280. The read increment block 260 receives the FIFO read pointer signal RPTR 245. The multiplexer 270 is coupled to each row of the $2^N$ rows in the set-clear register bank 250 through $2^N$ input lines 272. The multiplexer 270 is also coupled to the read increment block 260.

The read flip-flop 280 is coupled to the multiplexer 270 and receives the read clock RCLK 204. In one example, an output of the multiplexer 270 is provided at a NOT end of the read flip-flop 280. The read flip-flop 280 generates a memory empty signal 290. The FIFO read pointer counter 225 receives the memory empty signal 290. The asynchronous FIFO circuit 200 may include one or more additional components known to those skilled in the relevant art and are not discussed here for simplicity of the description.

The operation of the asynchronous FIFO circuit 200, illustrated in FIG. 2 is explained now. The FIFO write pointer counter 220 counts a number of data packets written into the data memory 205. Also, the FIFO read pointer counter 225 counts a number of data packets cleared from the data memory 205. The FIFO write pointer counter 220 stores a current write address and the FIFO write pointer signal WPTR 235 specify a row in the data memory 205 corresponding to the current write address. The FIFO read pointer counter 225 stores a current read address and the FIFO read pointer signal RPTR 245 specify a row in the data memory 205 corresponding to the current read address.

The FIFO write pointer signal WPTR 235 is incremented at one of a positive edge or a negative edge of the write clock WCLK 202 when the write enable signal WEN 230 is asserted. The FIFO read pointer signal RPTR 245 is incremented at one of the positive edge or the negative edge of the read clock RCLK 204 when the read enable signal REN 240 is asserted. A write operation performed on the data memory 205 is synchronized with the write clock WCLK 202, and a read operation performed on the data memory 205 is synchronized with the read clock RCLK 204. The write clock WCLK 202 is asynchronous to the read clock RCLK 204.

The set-clear register bank 250 has $2^N$ rows. The set-clear register bank 250 writes a set of status bit based on the FIFO write pointer signal WPTR 235 in response to the write enable signal WEN 230. The set-clear register bank 250 clears the set of status bit based on the FIFO read pointer signal RPTR 245 in response to the read enable signal REN 240. In one version, a logic unit associated with the asynchronous FIFO circuit 200 writes and clears the set of status bits in the set-clear register bank 250.

The logic unit is either embedded in the asynchronous FIFO circuit 200 or placed on a PCB (printed circuit board) along with the asynchronous FIFO circuit 200. The set-clear register bank 250 writes a set of status bits in the $2^N$ rows. Each row of the $2^N$ rows in the set-clear register bank stores a status bit of the set of status bits. In one example, each row stores a plurality of status bits. In another example, a status bit is at least one of bit '1' and bit '0'.

During the write operation, the write enable signal WEN 230 is asserted. The FIFO write pointer signal WPTR 235 specifies a row of the $2^N$ rows in the data memory 205 corresponding to the current write address. A data received on the write data path WDATA 210 is stored in the row of the data memory 205 corresponding to the current write address specified by the FIFO write pointer signal WPTR 235. The set-clear register bank 250 writes a status bit in a row of the $2^N$ rows in the set-clear register bank 250. The row in the set-clear register bank 250 is selected based on the FIFO write pointer signal WPTR 235.

In one example, each row of the $2^N$ rows in the set-clear register bank 250 corresponds to a row of the $2^N$ rows in the data memory 205. For example, when a write address specifies a first row in the data memory 205, a status bit is written in a first row of the set-clear register bank 250. The FIFO write pointer signal WPTR 235 is incremented to specify a next row of the $2^N$ rows in the data memory 205 corresponding to a next write address. For example, the FIFO write pointer signal WPTR 235 is incremented by one to specify a second row in the data memory 205.

During the read operation, the read enable signal REN 240 is asserted. The FIFO read pointer signal RPTR 245 specifies a row of the $2^N$ rows in the data memory 205 corresponding to the current read address specified by the FIFO read pointer signal RPTR 245. A data stored in the row of the data memory 205 is transferred to the read data path RDATA 215. The set-clear register bank 250 clears a status bit in the row of the $2^N$ rows in the set-clear register bank 250. The row in the set-clear register bank 250 is selected based on the FIFO read pointer signal RPTR 245.

For example, when a write address specifies a first row in the data memory 205, a data stored in the first row is transferred to the read data path RDATA 215 and a status bit is cleared in a first row of the set-clear register bank 250. The FIFO read pointer signal RPTR 245 is incremented to specify a next row of the $2^N$ rows in the data memory 205 corresponding to a next read address. For example, the FIFO read pointer signal RPTR 245 is incremented by one to specify a second row in the data memory 205.

The control circuit 252 receive the write enable signal WEN 230, the read enable signal REN 240, the FIFO write pointer signal WPTR 235, the FIFO read pointer signal RPTR 245, the write clock WCLK 202 and the read clock RCLK 204. The control circuit 252 generates the memory full signal 285 when the data memory 205 is full and the memory empty signal 290 when the data memory 205 is empty.

The write increment block 255 in the control circuit 252 receives the FIFO write pointer signal WPTR 235. The write increment block 255 increments the FIFO write pointer signal WPTR 235 by a defined integer value to generate a write incremental pointer. In one example, the write increment block 255 increments the FIFO write pointer signal WPTR 235 by one. The multiplexer 265 receives the write incremental pointer as a select line to select one line from the $2^N$ input lines 266. The multiplexer 265 is coupled to each row of the $2^N$ rows in the set-clear register bank 250.

Therefore, in an example, when the FIFO write pointer signal WPTR 235 specifies a first row of the data memory 205, the write incremental pointer selects a second row of the set-clear register bank. The write flip-flop 275 receives an output of the multiplexer 265 and the write clock WCLK 202 and generates the memory full signal 285. In one version, the write flip-flop 275 generates a bit '1' as memory full signal 285. In another version, the write flip-flop 275 generates a bit '0' as memory full signal 285.

It is assumed that the set of status bits stored initially in the set-clear register bank 250 have a value of bit '0'. In one example, when a write clock WCLK 202 is asserted and a data received on the write data path WDATA 210 is stored in a first row of the data memory 205, the set-clear register bank 250 writes a bit '1' in a first row of the set-clear register bank 250.

The write incremental pointer selects a second row which is having a bit '0' in the set-clear register bank 250. Thus, the write flip-flop 275 generates a bit '0' to indicate that the data memory 205 is not full.

The read increment block 260 in the control circuit 252 receives the FIFO read pointer signal RPTR 245. The read increment block 260 increments the FIFO read pointer signal RPTR 245 by a defined integer value to generate a read inverts this bit '1' and generates a bit '0' to indicate that the data memory 205 is not empty.

A table 1 illustrated below is used to further explain the operation of the asynchronous FIFO circuit 200. N is considered to be 2. Therefore, each of the data memory 205 and the set-clear register bank 250 has four rows. The addresses for these rows in the data memory 205 are 00, 10 and 11.

TABLE 1

| State | WCLK | WEN | WPTR | Write Incremental Pointer | REN | RCLK | RPTR | Read Incremental Pointer | Status Bits | Memory full signal | Memory empty signal | Condition | Operation |
|---|---|---|---|---|---|---|---|---|---|---|---|---|---|
| 1 | 1 | 1 | '00 | '01 | 0 | 0 | '00 | '01 | '0000 | 0 | 1 | Not Full & empty | Write to Data Memory |
| 2 | 1 | 1 | '01 | '10 | 0 | 0 | '00 | '01 | '0001 | 0 | 1 | Not Full & empty | Write to Data Memory |
| 3 | 1 | 1 | '10 | '11 | 0 | 0 | '00 | '01 | '0011 | 0 | 0 | Not Full & not empty | Write to Data Memory |
| 4 | 1 | 1 | '11 | '00 | 0 | 0 | '00 | '01 | '0111 | 1 | 0 | No write is honored till data is read | Write to Data Memory |
| 5 | 1 | 1 | '11 | '00 | 1 | 1 | '00 | '01 | '0111 | 1 | 0 | Full & not empty | Read from Data Memory |
| 6 | 1 | 1 | '11 | '00 | 1 | 1 | '01 | '10 | '0110 | 0 | 0 | Not Full & not empty | Read/Write from/to Data Memory |
| 7 | 0 | 0 | '00 | '01 | 1 | 1 | '10 | '11 | '1100 | 0 | 0 | Not Full & not empty | Read from Data Memory |
| 8 | 0 | 0 | '00 | '01 | 1 | 1 | '11 | '00 | '1000 | 0 | 1 | No read is honored till data is written | Read from Data Memory |
| 9 | 1 | 1 | '00 | '01 | 1 | 1 | '11 | '00 | '1000 | 0 | 1 | Not Full & empty | Write to Data Memory |
| 10 | 1 | 1 | '01 | '10 | 1 | 1 | '11 | '00 | '1001 | 0 | 0 | Not Full & not empty | Read/Write from/to Data Memory |
| 11 | 0 | 0 | '10 | '11 | 0 | 0 | '00 | '01 | '0011 | 0 | 0 | Not Full & not empty | IDLE | incremental pointer. In one example, the read increment block 260 increments the FIFO read pointer signal RPTR 245 by one. The multiplexer 270 receives the read incremental pointer as a select line to select one line from the $2^N$ input lines 272. The multiplexer 270 is coupled to each row of the $2^N$ rows in the set-clear register bank 250.

Therefore, in an example, when the FIFO read pointer signal RPTR 245 specifies a first row of the data memory 205, the read incremental pointer selects a second row of the set-clear register bank. The read flip-flop 280 receives an output of the multiplexer 270 and the read clock RCLK 204 and generates the memory empty signal 290.

When the output of the multiplexer 270 is provided at a NOT end of the read flip-flop 280, the output of the multiplexer 270 is inverted and then processed by the read flip-flop 280. In one version, the read flip-flop 280 generates a bit '1' as memory empty signal 290 indicating that the data memory 105 is empty. In another version, the read flip-flop 280 generates a bit '0' as memory empty signal 290 indicating that the data memory 105 is not empty.

After a complete write operation, it is assumed that the set of status bits stored initially in the set-clear register bank 250 have a value of bit '1'. In one example, when a read clock RCLK 204 is asserted and a data stored in the first row of the data memory 205 is transferred to the read data path RDATA 215 and the set-clear register bank 250 clears a bit '1' in the first row of the set-clear register bank 250. Thus, the first row of the set-clear register bank 250 has bit '0'. The read incremental pointer selects a second row which is having a bit '1' in the set-clear register bank 250. Thus, the read flip-flop 280

As illustrated, from state 1 to state 6, the write enable signal WEN 230 is asserted which is illustrated as bit '1'. In state 1, the FIFO write pointer signal WPTR 235 points to the current write address which is 00. When the write clock WCLK 202 is high, the data received on the write data path WDATA 210 is stored at the current write address 00. The four status bits stored in the set-clear register bank 250 are 0000. Thus, the write flip-flop 275 generates a bit '0' to indicate that the data memory 205 is not full and the read flip-flop 280 generates a bit '1' to indicate that the data memory 205 is empty. Thus, a write operation is performed on the data memory 205 during state 1. The FIFO write pointer signal WPTR 235 is incremented by '1' as the data memory 205 is not full and the write enable signal WEN 230 is asserted.

In state 2, the FIFO write pointer signal WPTR 235 points to the current write address which is 01. When the write clock WCLK 202 is high, the data received on the write data path WDATA 210 is stored at the current write address 01. Since, in state 1, the data was written at the memory address 00, a status bit in a first row of the set-clear register bank 250 transition to bit '1'. Thus, the four status bits stored in the set-clear register bank 250 are 0001. The write flip-flop 275 generates a bit '0' to indicate that the data memory 205 is not full and the read flip-flop 280 generates a bit '1' to indicate that the data memory 205 is empty. Thus, a write operation is performed on the data memory 205 during state 2. The FIFO write pointer signal WPTR 235 is incremented by '1' as the data memory 205 is not full and the write enable signal WEN 230 is asserted.

In state 3, the FIFO write pointer signal WPTR 235 points to the current write address which is 10. When the write clock WCLK 202 is high, the data received on the write data path WDATA 210 is stored at the current write address 10. Since in state 2, the data was written at the memory address 01, a status bit in a second row of the set-clear register bank 250 transition to bit '1'. Thus, the four status bits stored in the set-clear register bank 250 are 0011. The write flip-flop 275 generates a bit '0' to indicate that the data memory 205 is not full and the read flip-flop 280 generates a bit '0' to indicate that the data memory 205 is not empty. Thus, a write operation is performed on the data memory 205 during state 3. The FIFO write pointer signal WPTR 235 is incremented by '1' as the data memory 205 is not full and the write enable signal WEN 230 is asserted.

In state 4, the FIFO write pointer signal WPTR 235 points to the current write address which is 11. When the write clock WCLK 202 is high, the data received on the write data path WDATA 210 is stored at the current write address 11. Since in state 3, the data was written at the memory address 10, a status bit in a third row of the set-clear register bank 250 transition to bit '1'. Thus, the four status bits stored in the set-clear register bank 250 are 0111. The write flip-flop 275 generates a bit '1' to indicate that the data memory 205 is full and the read flip-flop 280 generates a bit '0' to indicate that the data memory 205 is not empty. Thus, a write operation is performed on the data memory 205 during state 4. However, any transfer of data from the data memory 205 to the read data path RDATA 215 is on hold during state 4. The FIFO write pointer signal WPTR 235 is not incremented as the data memory 205 is full As illustrated, from state 5 to state 8, the read enable signal REN 240 is asserted which is illustrated as bit '1'. In state 5, the FIFO read pointer signal RPTR 245 points to the current read address which is 00. When the read clock RCLK 204 is high, the data stored at the current read address 00 is transferred to the read data path RDATA 215. The four status bits stored in the set-clear register bank 250 are 0111. Thus, the write flip-flop 275 generates a bit '1' to indicate that the data memory 205 is full and the read flip-flop 280 generates a bit '0' to indicate that the data memory 205 is not empty. Thus, a read operation is performed on the data memory 205 during state 1. The FIFO write pointer signal WPTR 235 is not incremented as the data memory 205 is full. The FIFO read pointer signal RPTR 245 is incremented by '1' as the data memory 205 is not empty and the read enable signal REN 240 is asserted.

In state 6, the FIFO read pointer signal RPTR 245 points to the current read address which is 01. When the read clock RCLK 204 is high, the data stored at the current read address 01 is transferred to the read data path RDATA 215. Since, in state 5, the data was read at the memory address 00, a status bit in a first row of the set-clear register bank 250 transition to bit '0'. Thus, the four status bits stored in the set-clear register bank 250 are 0110. In addition, since the write enable is asserted in state 6 and the write clock WCLK 202 is high, the data received on the write data path WDATA 210 is stored at the current write address 11. The write flip-flop 275 generates a bit '0' to indicate that the data memory 205 is not full and the read flip-flop 280 generates a bit '0' to indicate that the data memory 205 is not empty. Thus, a read operation and a write operation are simultaneously performed on the data memory 205 during state 6. The FIFO write pointer signal WPTR 235 is incremented by '1' as the data memory 205 is not full and the write enable signal WEN 230 is asserted. The FIFO read pointer signal RPTR 245 is incremented by '1' as the data memory 205 is not empty and the read enable signal REN 240 is asserted.

In state 7, the FIFO read pointer signal RPTR 245 points to the current read address which is 10. When the read clock RCLK 204 is high, the data stored at the current read address 10 is transferred to the read data path RDATA 215. Since, in state 6, the data was read at the memory address 01 and the data was written at the memory address 11, a status bit in a second row of the set-clear register bank 250 transition to bit '0' and a status bit in a fourth row of the set-clear register bank 250 transition to bit '1'. Thus, the four status bits stored in the set-clear register bank 250 are 1100. The write flip-flop 275 generates a bit '0' to indicate that the data memory 205 is not full and the read flip-flop 280 generates a bit '0' to indicate that the data memory 205 is not empty. Thus, a read operation is performed on the data memory 205 during state 6. The FIFO read pointer signal RPTR 245 is incremented by '1' as the data memory 205 is not empty and the read enable signal REN 240 is asserted.

In state 8, the FIFO read pointer signal RPTR 245 points to the current read address which is 11. When the read clock RCLK 204 is high, the data stored at the current read address 11 is transferred to the read data path RDATA 215. Since, in state 7, the data was read at the memory address 10, a status bit in a third row of the set-clear register bank 250 transition to bit '0'. Thus, the four status bits stored in the set-clear register bank 250 are 1000. The write flip-flop 275 generates a bit '0' to indicate that the data memory 205 is not full and the read flip-flop 280 generates a bit '1' to indicate that the data memory 205 is empty. Thus, a read operation is performed on the data memory 205 during state 8. However, any further read operations are put on hold till a write operation is performed on the data memory 205. The FIFO read pointer signal RPTR 245 is not incremented as the data memory 205 is empty.

In state 9, the write enable signal WEN 230 and the read enable signal REN 240 are asserted. The FIFO write pointer signal WPTR 235 points to the current write address which is 00. When the write clock WCLK 202 is high, the data received on the write data path WDATA 210 is stored at the current write address 00. The four status bits stored in the set-clear register bank 250 are 1000. Thus, the write flip-flop 275 generates a bit '0' to indicate that the data memory 205 is not full and the read flip-flop 280 generates a bit '1' to indicate that the data memory 205 is not empty. Thus, a write operation is performed on the data memory 205 during state 1. The FIFO write pointer signal WPTR 235 is incremented by '1' as the data memory 205 is not full and the write enable signal WEN 230 is asserted.

In state 10, the write enable signal WEN 230 and the read enable signal REN 240 are asserted. The FIFO write pointer signal WPTR 235 points to the current write address which is 01. When the write clock WCLK 202 is high, the data received on the write data path WDATA 210 is stored at the current write address 01. Also, the FIFO read pointer signal RPTR 245 points to the current read address which is 11. When the read clock RCLK 204 is high, the data stored at the current read address 11 is transferred to the read data path RDATA 215. Since in state 9, the data was written at the memory address 00, a status bit in a first row of the set-clear register bank 250 transition to bit '1'. Thus, the four status bits stored in the set-clear register bank 250 are 1001. Thus, the write flip-flop 275 generates a bit '0' to indicate that the data memory 205 is not full and the read flip-flop 280 generates a bit '0' to indicate that the data memory 205 is not empty. Thus, a read operation and a write operation are simultaneously performed on the data memory 205 during state 10. The FIFO write pointer signal WPTR 235 is incremented by '1' as the data memory 205 is not full and the write enable signal WEN 230 is asserted. The FIFO read pointer signal RPTR 245 is incremented by '1' as the data memory 205 is not empty and the read enable signal REN 240 is asserted.

In state 11, the write enable signal WEN 230 and the read enable signal REN 240 are not asserted. Since in state 10, the data was read at the memory address 11, a status bit in a fourth row of the set-clear register bank 250 transition to bit '0'. Also, data was stored at the write address 01, therefore, a status bit in a second row of the set-clear register bank 250 transition to bit '1'. Thus, the four status bits stored in the set-clear register bank 250 are 0011. Thus, the write flip-flop 275 generates a bit '0' to indicate that the data memory 205 is not full and the read flip-flop 280 generates a bit '0' to indicate that the data memory 205 is not empty. Thus, the asynchronous FIFO circuit 200 is idle during state 11.

The asynchronous FIFO circuit 200 eliminates a need of comparators which were required in the conventional asynchronous FIFO circuit 100, illustrated in FIG. 1. This drastically improves the speed of operation of the asynchronous FIFO circuit 200. Also, with increase in size of the data memory 205, the size of the asynchronous FIFO circuit 200 is minimally impacted. However, in the conventional asynchronous FIFO circuit 100, an increase in the size of the data memory 205 would increase the size of the comparators and hence adversely impact the speed of operation.

Also, there is no need to synchronize the FIFO write pointer signal WPTR 235 and the FIFO read pointer signal RPTR 245 in the asynchronous FIFO circuit 200 which makes the asynchronous FIFO circuit 200 less prone to failures due to metastability. Thus, the asynchronous FIFO circuit 200 provides an increased throughput and operating frequency. In addition, the asynchronous FIFO circuit 200 is very stable and gives good performance even when the read clock RCLK 204 and the write clock WCLK 202 are operating in a close range.

Figure 3:
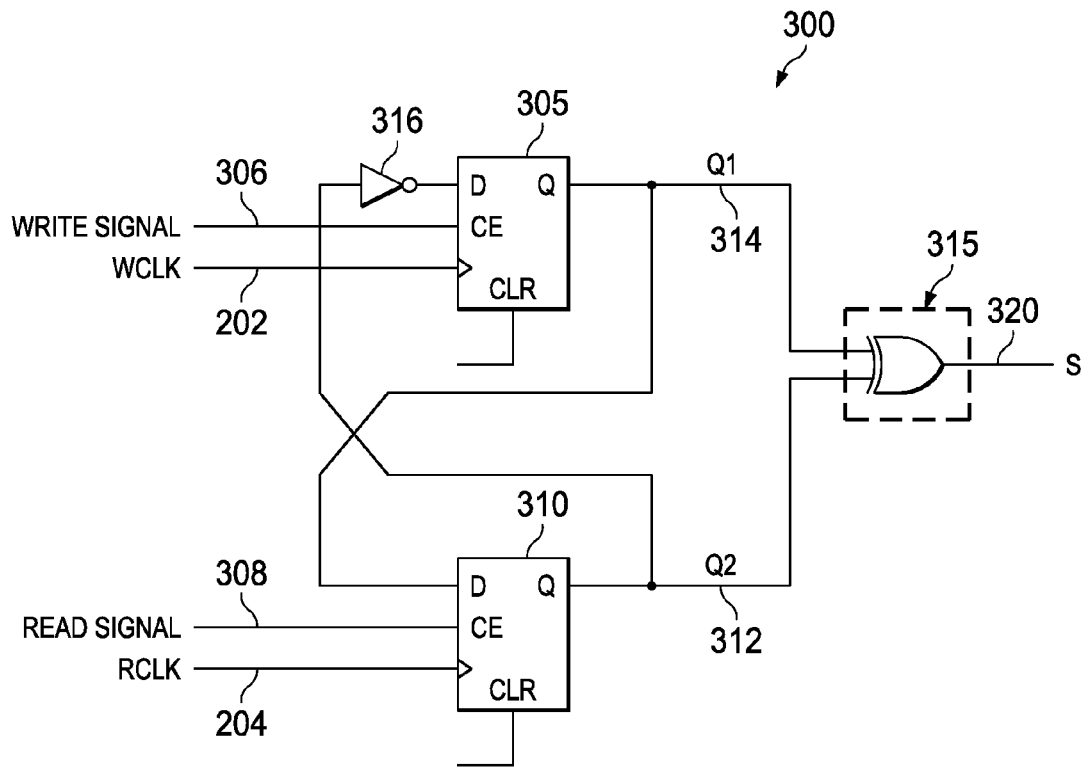
FIG. 3 illustrates a generator circuit.

FIG. 3 illustrates a generator circuit 300. It is noted that the generator circuit 300 is one of the many ways of implementing generator circuit 300 and variations, and alternative constructions are apparent and well within the spirit and scope of the disclosure. Each row of the $2^N$ rows in the set-clear register bank, for example set-clear register bank 250 (illustrated in FIG. 2) includes the generator circuit 300. The generator circuit 300 generates a status bit. The generator circuit 300 is explained with the help of the asynchronous FIFO circuit 200 illustrated in FIG. 2.

The generator circuit 300 includes a first flip-flop 305, a second flip-flop 310 and an exclusive-NOR logic circuit 315. The first flip-flop 305 receives the write clock WCLK 202 and a write signal 306 at an enable port (CE). The write signal 306 is obtained from the write enable signal WEN 230 and the FIFO write pointer signal WPTR 235. The first flip-flop 305 also receives a second output Q2 312 generated by the second flip-flop 310 through an inverter 316. The inverter 316 inverts the second output Q2 312 and provides an inverted second output to the first flip-flop 305. The inverted second output is received at an input port D of the first flip-flop 305. The first flip-flop 305 generates a first output Q1 314

The second flip-flop 310 receives the read clock RCLK 204 and a read signal 308 at an enable port (CE). The read signal 308 is obtained from the read enable signal REN 240 and the FIFO read pointer signal RPTR 245. The second flip-flop 310 also receives the first output Q1 314 at an input port D. The exclusive-NOR logic circuit 315 receives the first output Q1 314 and the second output Q2 312. The exclusive-NOR logic circuit 315 generates the status bit S 320. The generator circuit 300 may include one or more additional components known to those skilled in the relevant art and are not discussed here for simplicity of the description.

The operation of the generator circuit 300 illustrated in FIG. 3 is explained now. When the write enable signal WEN 230 is asserted and the FIFO write pointer signal WPTR 235 specifies a row in the data memory 205, the write signal 306 is at logic high or logic '1'. When the write clock WCLK 202 is at logic high, the first output Q1 314 is at logic 1 and hence the status bit S 320 is at logic '1'. When the read enable signal REN 240 is asserted and the FIFO read pointer signal RPTR 245 specifies a row in the data memory 205, the read signal 308 is at logic high or logic '1'. When the read clock RCLK 204 is at logic high, the second output Q2 312 is at logic '1'. Since, in the previous state, the first output Q1 314 was at logic 1, the status bit S 320 is at logic '0'.

Thus, the first output Q1 314 is at logic '1' and the second output Q2 312 is at logic '1'. When the write enable signal WEN 230 is again asserted and the write clock WCLK 202 is at logic high, the first output Q1 314 transition to logic '0' while the second output Q2 312 remains at logic '1'. Thus, the status bit S 320 transition to logic '1'.

Thus, the first output Q1 314 is at logic '0' and the second output Q2 312 is at logic '1'. When the read enable signal REN 240 is again asserted and the read clock RCLK 204 is at logic high, the second output Q2 312 transition to logic '0' while the first output Q1 314 remains at logic '0'. Thus, the status bit S 320 transition to logic '0'. The operation of the generator circuit 300 is further illustrated in Table 2 below. 'x' in Table 2 stands for one of logic '0' and logic '1'

TABLE 2

| Write Signal | WCLK | Read Signal | RCLK | Q1 | Q2 | S |
|---|---|---|---|---|---|---|
| 0 | x | 0 | x | 0 | 0 | 0 |
| 1 | 1 | 0 | x | 1 | 0 | 1 |
| 0 | x | 0 | x | 1 | 0 | 1 |
| 0 | x | 0 | x | 1 | 0 | 1 |
| 0 | x | 1 | 1 | 1 | 1 | 0 |
| 0 | x | 0 | x | 1 | 1 | 0 |
| 1 | 1 | 0 | x | 0 | 1 | 1 |
| 0 | x | 0 | x | 0 | 1 | 1 |
| 0 | x | 1 | 1 | 0 | 0 | 0 |

Figure 4:
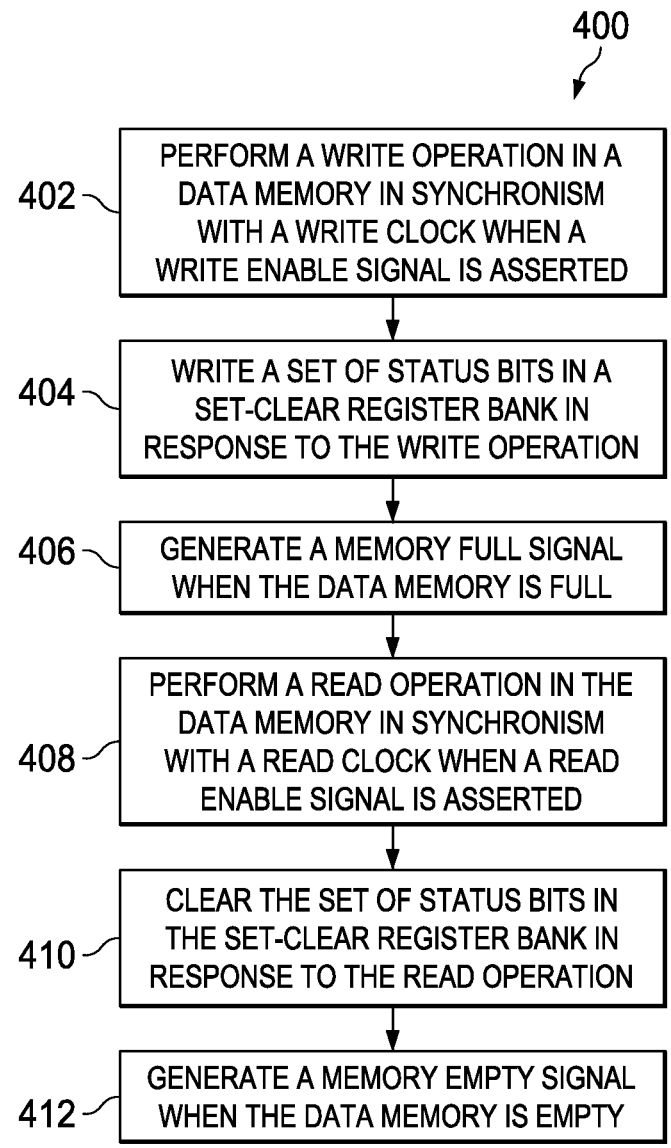
FIG. 4 is a flowchart illustrating a method according to an embodiment.

FIG. 4 is a flowchart 400 illustrating a method, according to an embodiment. At step 402, a write operation is performed in a data memory in synchronism with a write clock when a write enable signal is asserted. For example, in the asynchronous FIFO circuit 200, the write operation is performed in the data memory 205 in synchronism with the write clock WCLK 202 when the write enable signal WEN 230 is asserted. At step 404, a set of status bits are written in a set-clear register bank in response to the write operation.

In one example, when a write operation is performed on a row of the data memory, a status bit of the corresponding row in the set-clear register bank is written as bit '1'. A FIFO write pointer signal specifies a row in the data memory corresponding to a current write address. The FIFO write pointer signal is incremented by a defined integer value to generate a write incremental pointer. In one version, the FIFO write pointer signal is incremented by one to generate a write incremental pointer. The write incremental pointer is configured to specify a subsequent row in the set-clear register bank. If the FIFO write pointer signal specifies a first row in the data memory, the write incremental pointer specifies a second row in the set-clear register bank.

At step 406, a memory full signal is generated when the data memory is full. During the write operation, when the $2^N$ rows in the data memory 205 are written, the asynchronous FIFO circuit 200 generates the memory full signal. In one example, the memory full signal is generated when the status bit stored in the subsequent row of the set-clear register bank is written i.e. when the status bit stored in the subsequent row of the set-clear register bank is bit '1'.

At step 408, a read operation is performed in the data memory in synchronism with a read clock when a read enable signal is asserted. For example, in the asynchronous FIFO circuit 200, the read operation is performed in the data memory 205 in synchronism with the read clock RCLK 204 when the read enable signal REN 240 is asserted.

A FIFO read pointer signal specifies a row in the data memory corresponding to a current read address. The FIFO read pointer signal is incremented by a defined integer value to generate a read incremental pointer. In one version, the FIFO read pointer signal is incremented by one to generate a read incremental pointer. The read incremental pointer is configured to specify a subsequent row in the set-clear register bank. If the FIFO read pointer signal specifies a first row in the data memory, the read incremental pointer specifies a second row in the set-clear register bank.

At step 410, the set of status bits are cleared in the set-clear register bank in response to the read operation. In an example, when a read operation is performed on a row of the data memory, a status bit of the corresponding row in the set-clear register bank is cleared or written as bit '0'. At step 412, a memory empty signal is generated when the data memory is empty. During the read operation, when the $2^N$ rows in the data memory 205 have been read, the asynchronous FIFO circuit 200 generates the memory empty signal. In one example, the memory empty signal is generated when the status bit stored in the subsequent row of the set-clear register bank is cleared i.e. when the status bit stored in the subsequent row of the set-clear register bank is bit '0'.

Figure 5:
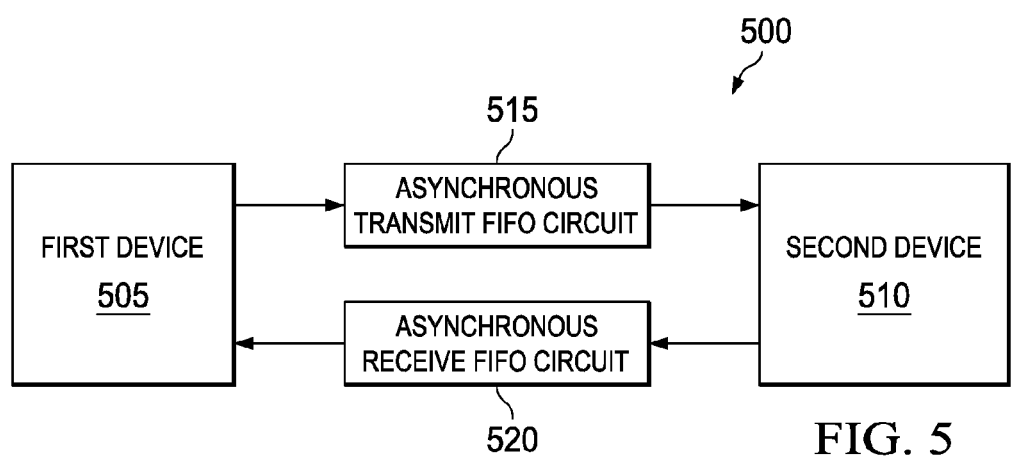
FIG. 5 illustrates an apparatus utilizing the asynchronous FIFO circuit illustrated in FIG. 2, according to an embodiment.

FIG. 5 illustrates an apparatus 500 utilizing the asynchronous FIFO circuit 200, according to an embodiment. The apparatus 500 is, or is incorporated into, a mobile communication device, such as a mobile phone, a personal digital assistant, a transceiver, a personal computer, or any other type of electronic system. The apparatus 500 may include one or more additional components known to those skilled in the relevant art and are not discussed here for simplicity of the description.

The apparatus 500 includes a first device 505 and a second device 510. The first device 505 and the second device 510 is one of the following, but not limited to, a computing device, a processing unit, a memory module, and a tester. The processing unit can be, for example, a CISC-type (Complex Instruction Set Computer) CPU, RISC-type CPU (Reduced Instruction Set Computer), or a digital signal processor (DSP). The memory module can be memory such as RAM, flash memory, or disk storage. In one example, the first device 505 and the second device 510 are intelligent or active devices. In another example, at least one of the first device 505 and the second device 510 is a passive device.

The apparatus 500 includes an asynchronous transmit FIFO circuit 515 and an asynchronous receive FIFO circuit 520 coupled between the first device 505 and the second device 510. At least one of the asynchronous transmit FIFO circuit 515 and the asynchronous receive FIFO circuit 520 is analogous to the asynchronous FIFO circuit 200 in connection and operation.

In one example, both the asynchronous transmit FIFO circuit 515 and the asynchronous receive FIFO circuit 520 are analogous to the asynchronous FIFO circuit 200. The asynchronous transmit FIFO circuit 515 (or the asynchronous receive FIFO circuit 520) eliminates a need of comparators which were required in the conventional asynchronous FIFO circuit. This drastically improves the speed of operation of the asynchronous transmit FIFO circuit 515 (or the asynchronous receive FIFO circuit 520).

Also, there is no need to synchronize the write pointer signal and the read pointer signal in the asynchronous transmit FIFO circuit 515 (or the asynchronous receive FIFO circuit 520) which makes it less prone to failures due to metastability. Thus, the asynchronous transmit FIFO circuit 515 (or the asynchronous receive FIFO circuit 520) provides an increased throughput and operating frequency. In addition, the asynchronous transmit FIFO circuit 515 (or the asynchronous receive FIFO circuit 520) is very stable and gives good performance even when the read clock and the write clock are operating in a close range.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections.

Further, the term "high" is generally intended to describe a signal that is at logic "1," and the term "low" is generally intended to describe a signal that is at logic "0." The term "on" applied to a transistor or group of transistors is generally intended to describe gate biasing to enable current flow through the transistor or transistors. Also, the terms "inactivation" or "inactivated" or turn "OFF" or turned "OFF" is used to describe a deactivation of a device, a component or a signal. The terms "activation" or "activated" or turned "ON" describes activation of a device, a component or a signal.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. An asynchronous FIFO (first-in-first-out) circuit comprising:
   a data memory coupled to a write data path and a read data path, the data memory configured to receive a write clock and a read clock;
   a FIFO write pointer counter configured to receive a write enable signal and the write clock, the FIFO write pointer counter configured to provide a FIFO write pointer signal to the data memory,
   a FIFO read pointer counter configured to receive a read enable signal and the read clock, the FIFO read pointer counter configured to provide a FIFO read pointer signal to the data memory; and
   a control circuit configured to receive the write enable signal, the read enable signal, the FIFO write pointer signal, the FIFO read pointer signal, the write clock and the read clock, the control circuit configured to generate a memory full signal when the data memory is full and a memory empty signal when the data memory is empty.

2. The asynchronous FIFO circuit of claim 1, wherein the data memory has $2^N$ rows and each row of the $2^N$ rows is configured to store M bits, M and N are integers.

3. The asynchronous FIFO circuit of claim 1, wherein the control circuit further comprises a set-clear register bank, the set-clear register bank is configured to write a set of status bits in response to the write enable signal and the FIFO write pointer signal, and wherein the set-clear register bank is configured to clear the set of status bits in response to the read enable signal and the FIFO read pointer signal.

4. The asynchronous FIFO circuit of claim 3, wherein the set-clear register bank has $2^N$ rows and each row of the $2^N$ rows is configured to store a status bit of the set of status bits.

5. The asynchronous FIFO circuit of claim 1, wherein:
the FIFO write pointer counter is configured to store a current write address, and the FIFO write pointer signal is configured to specify a row in the data memory corresponding to the current write address; and
the FIFO read pointer counter is configured to store a current read address and the FIFO read pointer signal is configured to specify a row in the data memory corresponding to the current read address.

6. The asynchronous FIFO circuit of claim 1, wherein the FIFO write pointer counter is configured to receive the memory full signal, and the FIFO read pointer counter is configured to receive the memory empty signal.

7. The asynchronous FIFO circuit of claim 1, wherein the FIFO write pointer signal is incremented at one of a positive edge or a negative edge of the write clock when the write enable signal is asserted and the data memory is not full.

8. The asynchronous FIFO circuit of claim 1, wherein the FIFO read pointer signal is incremented at one of a positive edge or a negative edge of the read clock when the read enable signal is asserted and the data memory is not empty.

9. The asynchronous FIFO circuit of claim 1, wherein a write operation performed on the data memory is synchronized with the write clock, and a read operation performed on the data memory is synchronized with the read clock, and wherein the write clock is asynchronous to the read clock.

10. The asynchronous FIFO circuit of claim 9, wherein during the write operation:
the write enable signal is configured to be asserted;
the FIFO write pointer signal is configured to specify a row of the $2^N$ rows in the data memory corresponding to the current write address;
a data received on the write data path is stored in the row of the $2^N$ rows in the data memory;
the set-clear register bank is configured to write the status bit in a row of the $2^N$ rows in the set-clear register bank; and
the FIFO write pointer signal is incremented to specify a next row of the $2^N$ rows in the data memory corresponding to a next write address.

11. The asynchronous FIFO circuit of claim 9, wherein during a read operation:
the read enable signal is configured to be asserted;
the FIFO read pointer signal is configured to specify a row of the $2^N$ rows in the data memory corresponding to the current read address;
the data stored in the row of the $2^N$ rows in the data memory is transferred to the read data path;
the set-clear register bank is configured to clear the status bit in the row of $2^N$ rows in the set-clear register bank; and the FIFO read pointer signal is incremented to point to the next row of the $2^N$ rows in the data memory corresponding to a next read address.

12. The asynchronous FIFO circuit of claim 1, wherein the control circuit further comprises:
a write increment block configured to receive the FIFO write pointer signal and configured to increment the FIFO write pointer signal by a defined integer value to generate a write incremental pointer;
a multiplexer coupled to each row of the $2^N$ rows in the set-clear register bank and configured to receive the write incremental pointer as a select line for the multiplexer, and
a write flip-flop configured to receive an output of the multiplexer and the write clock, the write flip-flop configured to generate the memory full signal when the data memory is full.

13. The asynchronous FIFO circuit of claim 1, wherein the control circuit further comprises:
a read increment block configured to receive the FIFO read pointer signal and configured to increment the FIFO read pointer signal by a defined integer value to generate a read incremental pointer,
a multiplexer coupled to each row of the $2^N$ rows in the set-clear register bank and configured to receive the read incremental pointer as a select line for the multiplexer; and
a read flip-flop configured to receive an output of the multiplexer and the read clock, the read flip-flop configured to generate the memory empty signal when the data memory is empty.

14. The asynchronous FIFO circuit of claim 1, wherein each row of the $2^N$ rows in the set-clear register bank comprises a generator circuit, the generator circuit comprising:
a first flip-flop configured to receive the write enable signal, the write clock, the FIFO write pointer signal and an inverted second output, the first flip-flop configured to generate a first output;
a second flip-flop configured to receive the read enable signal, the read clock, the FIFO read pointer signal and the first output, the second flip-flop configured to generate a second output;
an inverter configured to receive the second output, and configured to invert the second output to generate the inverted second output; and
an exclusive-NOR logic circuit configured to receive the first output and the second output, the exclusive-NOR logic circuit configured to generate the status bit.

15. A method comprising:
performing a write operation in a data memory in synchronism with a write clock when a write enable signal is asserted;
writing a set of status bits in a set-clear register bank in response to the write operation;
generating a memory full signal when the data memory is full;
performing a read operation in the data memory in synchronism with a read clock when a read enable signal is asserted;
clearing the set of status bits in the set-clear register bank in response to the read operation; and
generating a memory empty signal when the data memory is empty.

16. The method of claim 15 further comprising:
performing the write operation in a row of the data memory;

writing a status bit in a corresponding row of the set-clear register bank; and incrementing a FIFO write pointer signal by a defined integer value to generate a write incremental pointer, wherein the FIFO write pointer signal is configured to specify the row in the data memory corresponding to a current write address, and wherein the write incremental pointer is configured to specify a subsequent row in the set-clear register bank.

17. The method of claim 16, wherein generating the memory full signal when the status bit stored in the subsequent row of the set-clear register bank is written.

18. The method of claim 15 further comprising:

performing the read operation in a row of the data memory;

clearing a status bit in a corresponding row of the set-clear register bank; and incrementing a FIFO read pointer signal by a defined integer value to generate a read incremental pointer, wherein the FIFO read pointer signal is configured to specify the row in the data memory corresponding to a current read address, and wherein the read incremental pointer is configured to specify a subsequent row in the set-clear register bank.

19. The method of claim 18, wherein generating a memory empty signal when the status bit stored in the subsequent row of the set-clear register bank is cleared.

20. An apparatus comprising:

a first device configured to operate at a write clock;

a second device configured to operate at a read clock; and an asynchronous transmit FIFO circuit and an asynchronous receive FIFO circuit coupled between the first device and the second device, at least one of the asynchronous transmit FIFO circuit and the asynchronous receive FIFO circuit comprising:

a data memory coupled to a write data path and a read data path, the data memory configured to receive a write clock and a read clock;

a FIFO write pointer counter configured to receive a write enable signal and the write clock, the FIFO write pointer counter configured to provide a FIFO write pointer signal to the data memory;

a FIFO read pointer counter configured to receive a read enable signal and the read clock, the FIFO read pointer counter configured to provide a FIFO read pointer signal to the data memory; and a control circuit configured to receive the write enable signal, the read enable signal, the FIFO write pointer signal, the FIFO read pointer signal, the write clock and the read clock, the control circuit configured to generate a memory full signal when the data memory is full and a memory empty signal when the data memory is empty.

* * * * *